United States Patent
Tustaniwskyi et al.

(10) Patent No.: US 7,310,230 B2
(45) Date of Patent: Dec. 18, 2007

(54) TEMPERATURE CONTROL SYSTEM WHICH SPRAYS LIQUID COOLANT DROPLETS AGAINST AN IC-MODULE AT A SUB-ATMOSPHERIC PRESSURE

(75) Inventors: Jerry Ihor Tustaniwskyi, Mission Viejo, CA (US); James Wittman Babcock, Escondido, CA (US)

(73) Assignee: Delta Design, Inc., Poway, CA (US)

( * ) Notice: Subject to any disclaimer, the term of this patent is extended or adjusted under 35 U.S.C. 154(b) by 276 days.

(21) Appl. No.: 10/647,090

(22) Filed: Aug. 21, 2003

(65) Prior Publication Data

US 2005/0041393 A1    Feb. 24, 2005

(51) Int. Cl.
*H05K 7/20*    (2006.01)

(52) U.S. Cl. ............... 361/699; 361/687; 361/689; 62/259.2; 324/760

(58) Field of Classification Search ............... 361/689, 361/697, 698, 699, 719, 721; 62/118, 119, 62/132, 171, 64, 259.2; 165/80.4, 104.33, 165/908; 324/158.1, 760, 755; 239/443, 239/444, 463, 465; 257/715; 414/416, 422, 414/783

See application file for complete search history.

(56) References Cited

U.S. PATENT DOCUMENTS

| | | | |
|---|---|---|---|
| 3,710,251 A * | 1/1973 | Hagge et al. ............... | 324/760 |
| 4,698,728 A | 10/1987 | Tustaniwskyj et al. | |
| 4,897,762 A * | 1/1990 | Daikoku et al. ............ | 361/689 |
| 5,048,599 A | 9/1991 | Tustaniwskyj et al. | |
| 5,515,910 A | 5/1996 | Hamilton et al. | |
| 5,831,824 A * | 11/1998 | McDunn et al. ............ | 361/699 |
| 5,846,852 A * | 12/1998 | Limper-Brenner et al. . | 438/118 |
| 6,349,554 B2 * | 2/2002 | Patel et al. ................. | 62/259.2 |
| 6,484,521 B2 * | 11/2002 | Patel et al. .................... | 62/171 |
| 6,550,263 B2 * | 4/2003 | Patel et al. ................. | 62/259.2 |
| 6,857,283 B2 * | 2/2005 | Tilton et al. ................ | 62/259.2 |
| 6,861,861 B2 * | 3/2005 | Song et al. .................. | 324/760 |
| 6,880,350 B2 * | 4/2005 | Tilton .......................... | 62/171 |
| 6,889,509 B1 * | 5/2005 | Cader et al. .................. | 62/118 |
| 2002/0017916 A1 * | 2/2002 | Costello et al. ............. | 324/760 |
| 2002/0050144 A1 | 5/2002 | Patel et al. | |
| 2002/0112498 A1 | 8/2002 | Bash et al. | |
| 2002/0113142 A1 | 8/2002 | Patel et al. | |
| 2002/0163782 A1 | 11/2002 | Cole et al. | |
| 2003/0098692 A1 | 5/2003 | Cotton et al. | |
| 2004/0032274 A1 * | 2/2004 | Cader et al. ................. | 324/760 |

FOREIGN PATENT DOCUMENTS

EP    0 480 750 A2    4/1992

* cited by examiner

*Primary Examiner*—Michael Datskovskiy
(74) *Attorney, Agent, or Firm*—Foley & Lardner LLP

(57) ABSTRACT

A system for maintaining an IC-chip near a set-point temperature while electrical power dissipation in the IC-chip is varied includes a container having an open end with a seal ring. Located in the container is at least one nozzle for spraying liquid coolant droplets on a portion of an IC-module which holds the IC-chip. This spraying of the liquid coolant occurs while the seal ring is pressed against the IC-module. Also, a pressure reducing means is coupled to the container for producing a sub-atmospheric pressure in the space between the container and the IC-module while the seal ring is pressed against the IC-module.

31 Claims, 13 Drawing Sheets

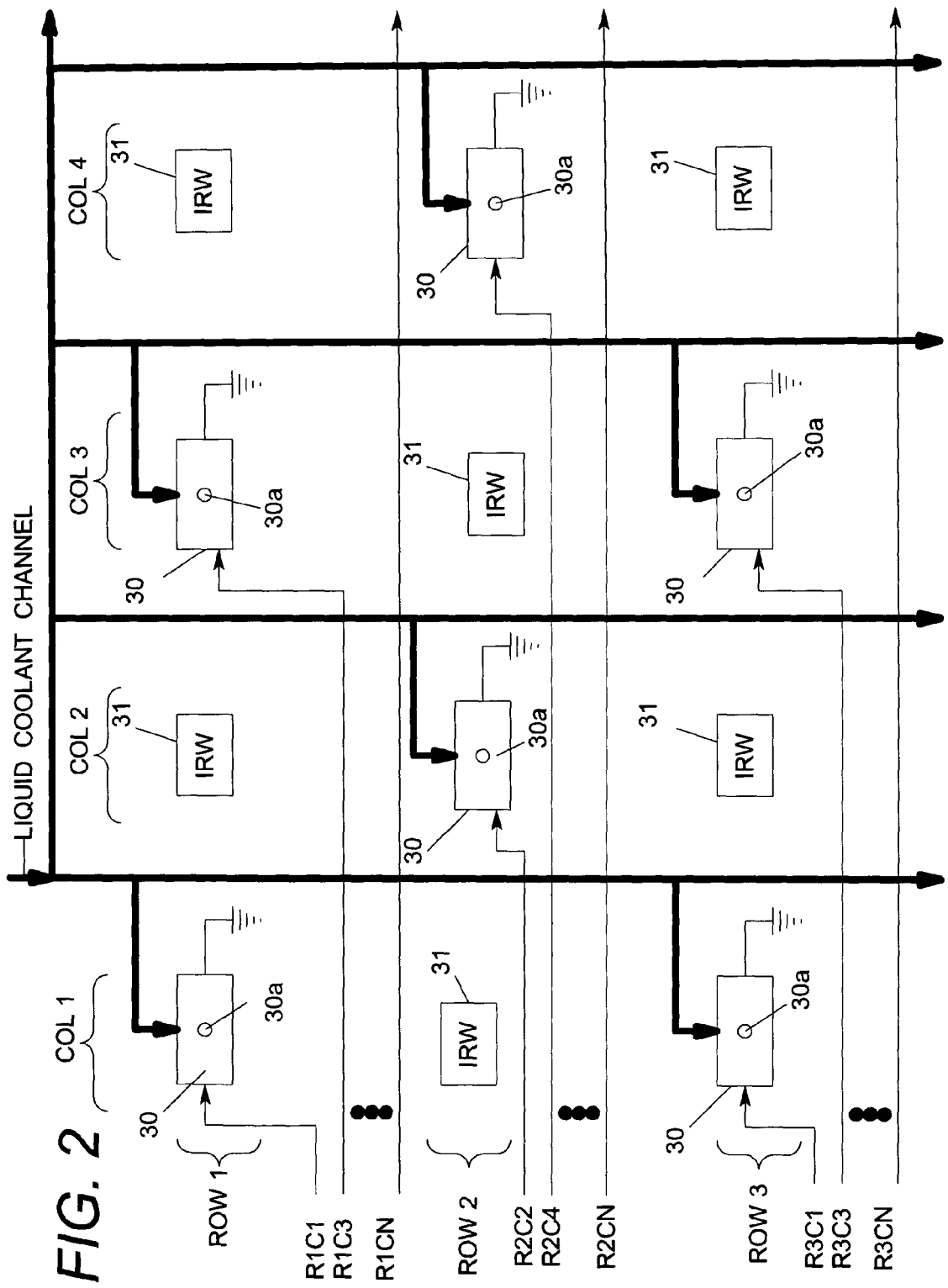

Fig 3B

Chip Power = 200W
Chip Temp stays at Tc

Fig 3A

Chip power = 100W
Chip Temp = Tc

Chip Power = 300W
Chip Temp stays at Tc

Chip Power = 0W
Chip Temp stays at Tc

FIG. 4 eq. 1 ~ $1\ drop = 10\ picoliter = 10*10^{-12}\ lit\ \dfrac{10^3\ gr}{lit} = 10^{-8}\ gr$ eq. 2 ~ $\Delta Q/drop = \left[(\Delta T)(c_P) + 2260 \dfrac{J}{gr}\right]\left[\dfrac{10^{-8}\ gr}{drop}\right] \approx 20 \dfrac{\mu J}{drop}$ eq. 3 ~ $400 \dfrac{J}{sec} = 20 \dfrac{\mu J}{drop} \left[\dfrac{\#\ of}{nozzles}\right]\left[\dfrac{control\ signal\ freq}{}\right]$ eq. 4 ~ if freq = $10^4$ cycles/sec, then $\left[\dfrac{\#\ of}{nozzles}\right] = 2000$ eq. 5 ~ nozzle array = (45) x (45) nozzles on 1 square inch eq. 6 ~ nozzle spacing = $\dfrac{2.54\ cm}{45\ nozzles} = \dfrac{560\ \mu m}{nozzle}$ eq. 7 ~ area per nozzle = $50\mu m \times 100\mu m$
area per IR-window = $20\ \mu m \times 20\mu m$

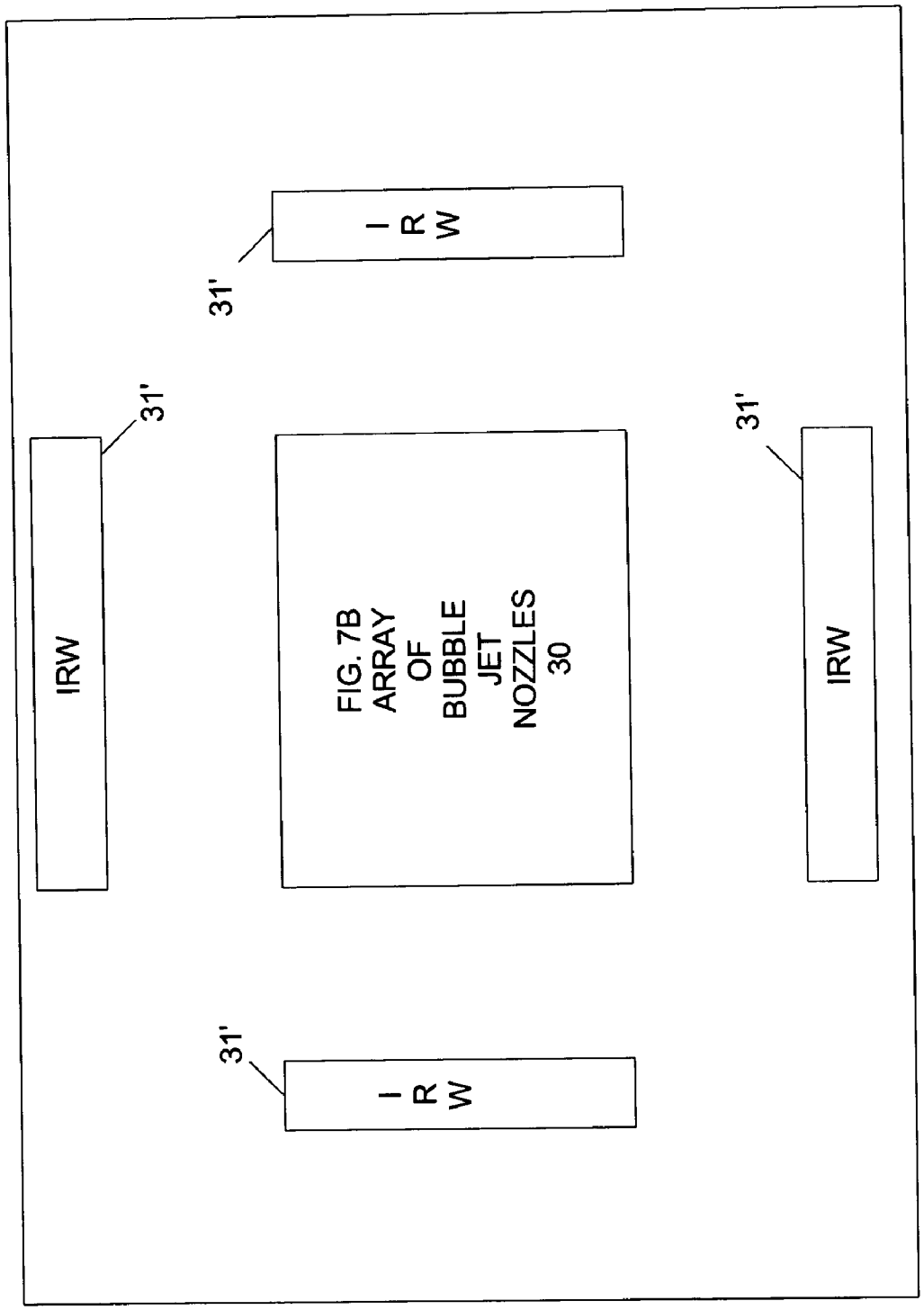

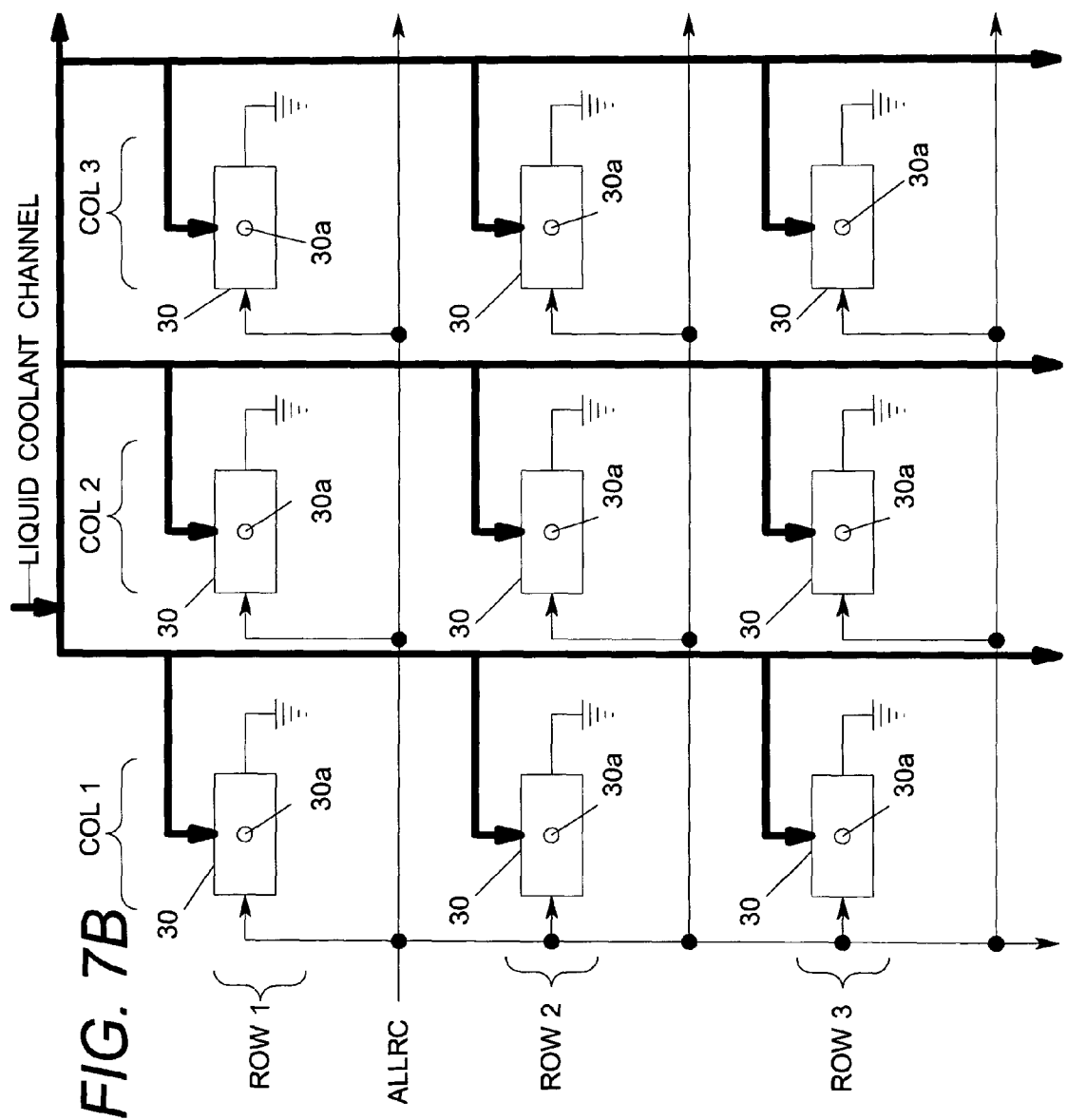

TEMPERATURE CONTROL SYSTEM WHICH SPRAYS LIQUID COOLANT DROPLETS AGAINST AN IC-MODULE AT A SUB-ATMOSPHERIC PRESSURE

RELATED CASES

The above-identified invention is related to one other invention which is described herein with a single Detailed Description. The other related invention is disclosed in U.S. Ser. No. 10/647,091, entitled "TEMPERATURE CONTROL SYSTEM WHICH SPRAYS LIQUID COOLANT DROPLETS AGAINST AN IC-MODULE AND DIRECTS RADIATION AGAINST THE IC-MODULE," now U.S. Pat. No. 6,995,980. U.S. patent applications on both inventions were concurrently filed on Aug. 21, 2003.

BACKGROUND OF THE INVENTION

The present invention relates to temperature control systems for maintaining the temperature of an integrated circuit chip (IC-chip) near a constant st point temperature while the IC-chip is being tested. Also the present invention relates to subassemblies which comprise key portions of the above temperature control systems.

The IC-chip whose temperature is being regulated typically is part of an integrated circuit module. In the IC-module, the IC-chip usually is mounted on a substrate and covered with a lid. Alternatively, an uncovered IC-chip can be mounted on the substrate. Any type of circuitry can be integrated into the IC-chip, such as digital logic circuitry, or memory circuitry, or analog circuitry. Further, the circuitry in the IC-chip can be comprised of any type of transistors, such as field effect transistors or bipolar transistors.

One reason for trying to keep the temperature of an IC-chip constant, while the IC-chip is tested, is that the speed with which the IC-chip operates may be temperature dependent. For example, an IC-chip which is comprised of complementary field effect transistors (CMOS transistors) typically operates faster as the temperature of the IC-chip is decreased.

A common practice in the IC-chip industry is to mass produce a particular type of IC-chip, and thereafter speed sort them and sell the faster operating IC-chips at a higher price. CMOS memory chips and CMOS microprocessor chips are processed in this fashion. However, in order to properly determine the speed of such IC-chips, the temperature of each IC-chip must be kept nearly constant while the speed test is performed.

Maintaining the IC-chip temperature near a constant set point is relatively easy if the instantaneous power dissipation of the IC-chip is constant, or varies in a small range, while the speed test is being performed. In that case, it is only necessary to couple the IC-chip through a fixed thermal resistance to a thermal mass which is at a fixed temperature. For example, if the maximum IC-chip power variation is only ten watts, and the thermal resistance between the IC-chip and the thermal mass is 0.2 degrees centigrade per watt, then the maximum variation in the IC-chip temperature will only be two degrees centigrade.

But, if the instantaneous power dissipation of the chip varies up and down in a wide range while the speed test is being performed, then maintaining the IC-chip temperature near a constant set point is very difficult. Each time the power dissipation in the IC-chip makes a big change, its temperature and its speed will also make a big change.

The instantaneous power dissipation of a present day microprocessor chip typically varies from zero to over one-hundred watts. Also, the trend in the IC-chip industry is to continually increase the total number of transistors on an IC-chip, and that increases the maximum power dissipation of the IC-chip. Further, in one type of test that is called "burn-in", the power dissipation in the IC-chip is larger than normal because the voltage to the IC-chip is increased in order to accelerate the occurrence of failure.

In the prior art, one control system for maintaining the temperature of a high power IC-chip near a set point while the IC-chip is tested is disclosed in U.S. Pat. No. 5,821,505 (entitled "TEMPERATURE CONTROL SYSTEM FOR AN ELECTRONIC DEVICE WHICH ACHIEVES A QUICK RESPONSE BY INTERPOSING A HEATER BETWEEN THE DEVICE AND A HEAT SINK"). The '505 temperature control system includes a thin flat electric heater which has on surface that gets pressed against a corresponding surface on the IC-module, and has an opposite surface which is rigidly connected to a cooling jacket that carries a liquid coolant. The corresponding surface of the IC-module can be the lid which covers the IC-chip, or the IC-chip itself if there is no lid.

To cool the IC-chip at a maximum rate in the '505 temperature control system, the electric heater is turned off. Then heat quickly travels from the IC-chip through the electric heater to the cooling jacket. To reduce the rate at which heat travels from the IC-chip through the electric heater to the cooling jacket, the electric heater is turned on at a low level. To add heat to the IC-chip, the electric heater is turned on at a high level.

However, in the '505 temperature control system, a thermal resistance exists between the surfaces of the electric heater and the corresponding surface of the IC-module that get pressed together. This thermal resistance occurs due to microscopic mismatches between the two contacting surfaces.

The above thermal resistance times the power dissipation in the IC-chip equals a rise in temperature which occurs from the electric heater to the IC-chip when the electric heater is turned off to cool the IC-chip. This temperature rise limits the maximum power dissipation which can occur in the IC-chip without causing the IC-chip to overheat and destroy itself. Thus, the maximum power dissipation which can be tolerated without destroying the IC-chip is limited by the magnitude of the thermal resistance.

Further in the '505 temperature control system, the electrical heater inherently has a thermal mass. The larger that thermal mass is, the longer it takes to change the temperature of the electrical heater. Consequently, the thermal mass of the electrical heater limits the speed at which the temperature of the IC-chip can be regulated.

Accordingly, a primary object of the inventions which are disclosed herein is to provide a totally different structure for a temperature control systems, which completely avoids the above limitation of the '505 temperature control system.

BRIEF SUMMARY OF THE INVENTION

In accordance with the present invention, a system for maintaining an IC-chip near a set-point temperature while electrical power dissipation in the IC-chip is varied includes an open container having a bottom and surrounding sides with a seal ring. Located in the bottom of the container is at least one nozzle for spraying liquid coolant droplets on a portion of an IC-module which holds the IC-chip. This spraying of the liquid coolant occurs while the seal ring is pressed against the IC-module. Also, a pressure reducing means is coupled to the container for producing a sub-atmospheric pressure in the space between the container and the IC-module while the seal ring is pressed against the IC-module.

When each droplet of coolant hits the IC-module, heat is transferred from the IC-module directly to the coolant droplet. The thermal resistance from the IC-module to the coolant droplet is very small. Thus the thermal resistance limitation, which occurs in the '505 temperature regulating system, is completely avoided.

The heat transfer from the IC-module to each coolant droplet occurs in a time period Δt which decreases as the difference between the temperature of the IC-chip ($T_{IC}$), and the vaporization temperature of the droplet ($T_V$) increases. By maintaining the inside of the container at a sub-atmospheric pressure, the vaporization temperature $T_V$ is reduced. Thus the difference between $T_{IC}$ and $T_V$ is increased, and so the speed at which each droplet vaporizes and cools the IC-package is increased from that which would otherwise occur if the pressure in the container is at, or above, atmospheric pressure.

When the total number of droplets that are vaporized per second, times the heat of vaporization per droplet, exceeds the power which the IC-chip is dissipating, then the temperature of the IC-chip gets reduced. However, the minimum temperature to which the IC-chip can be reduced is just slightly above the vaporization temperature of the droplets. Thus, with the present invention, the lowest temperature to which the IC-chip can be maintained is lower than that which would otherwise occur if the pressure in the container is at, or above, atmospheric pressure.

Also, the sub-atmospheric pressure within the container makes the seal ring leak tolerant. If a leak occurs between the seal ring and the IC-module, only air will get sucked into the container. No liquid coolant will leak out of the container onto the IC-module where it could cause electrical shorts.

BRIEF DESCRIPTION OF THE DRAWINGS

FIG. 2 shows additional details of an array of nozzles which sprays droplets of liquid coolant, and IR-windows which pass radiation, in the FIG. 1 system.

FIGS. 3A–3D show several patterns of coolant droplets and radiation which are sent by the FIG. 2 array.

FIG. 4 shows a set of equations which contain numerical details of one specific implementation of the FIG. 2 array.

FIG. 7A shows a second alternative array of nozzles and IR-windows which can replace the FIG. 2 array in the FIG. 1 temperature control system.

FIG. 7B shows additional details of the array in FIG. 7A.

DETAILED DESCRIPTION

One preferred temperature regulating system, which incorporates the present invention, will now be described with reference to FIGS. 1, 2, 3A–3D, 4 and 5A–5B. An overview of this temperature regulating system is shown in FIG. 1.

Figure 1:
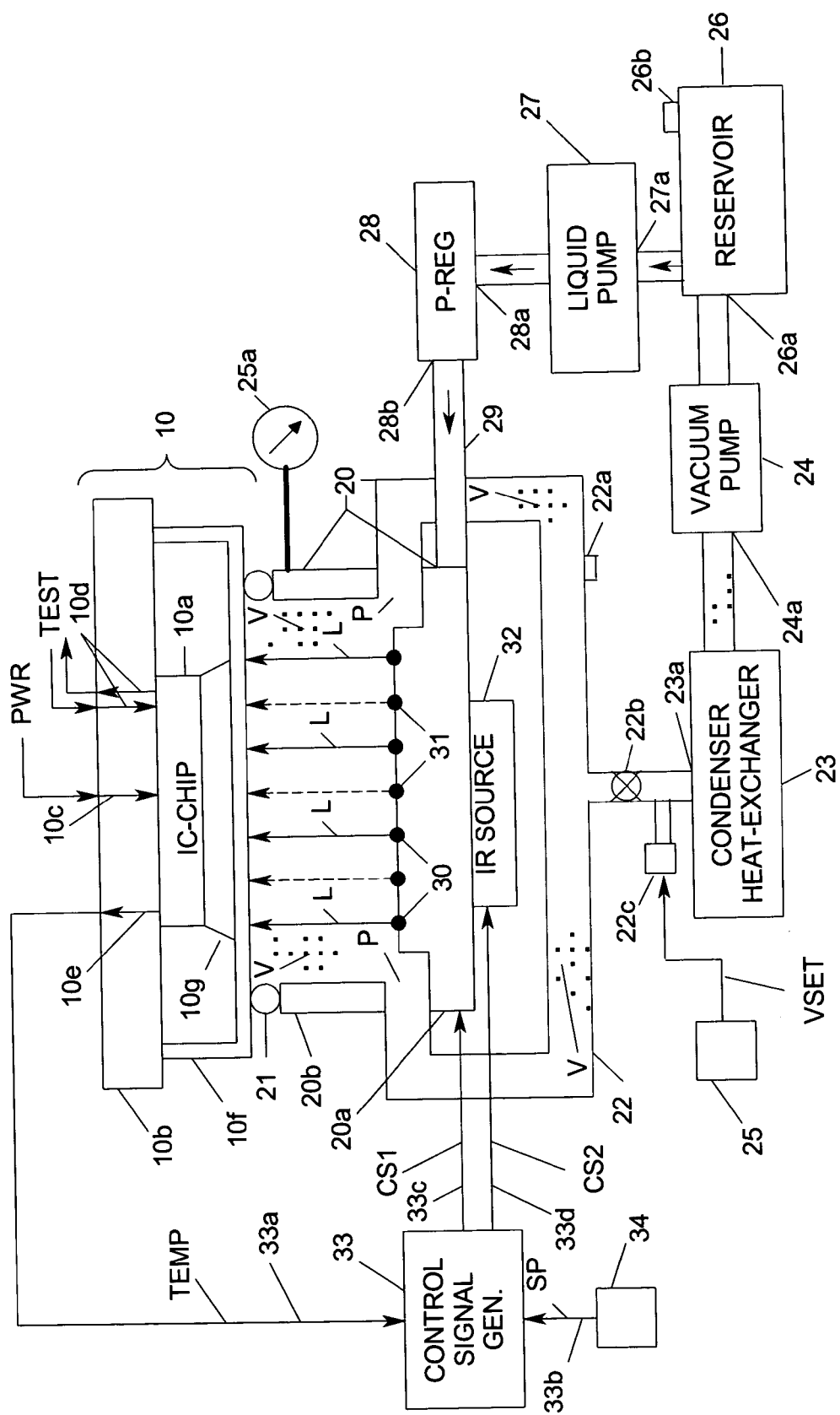
FIG. 1 shows an overview of a first embodiment of a temperature regulating system which incorporates the present invention.

In FIG. 1, the temperature regulating system is comprised of everything that is shown except item 10. Item 10 is an IC-module (integrated circuit module) on which the temperature regulating system operates. This IC-module 10 includes components 10a–10g, each of which is described in TABLE 1 below.

TABLE 1

| Component | Description |
|---|---|
| 10a | Component 10a is an IC-chip (integrated circuit chip) which is enclosed within the IC-module 10. |
| 10b | Component 10b is a substrate which holds the IC-chip 10a. |
| 10c | Component 10c is one or more conductors, in the substrate 10b, which carry electrical power PWR to the IC-chip 10a. |
| 10d | Component 10d is one or more conductors, in the substrate 10b, which carry TEST signals to and from the IC-chip 10a. |
| 10e | Component 10e is one or more conductors, in the substrate 10b, which carry TEMP signals from the IC-chip 10a. |
| 10f | Component 10f is a lid which is attached to the substrate 10b and which encloses the IC-chip 10a. |
| 10g | Component 10g is a thermal interface_material which fills a gap between the IC-chip 10a and the lid 10f. |

In operation, the FIG. 1 temperature regulating system maintains the temperature of the IC-chip 10a near a set-point temperature, while the power which the IC-chip 10a dissipates is varied in response to the TEST signals. To accomplish this operation, the FIG. 1 temperature regulating system includes components 20–34, each of which is described in TABLE 2 below.

TABLE 2

| Component | Description |
|---|---|
| 20 | Component 20 is a container which has one open end that faces the IC-package 10. The bottom of the container 20 is identified by reference numeral 20a, and the sidewall of the container is identified by reference numeral 20b. Two vacuum ports P are in the sidewall 20b. |
| 21 | Component 21 is a seal ring, on the sidewall 20b. This seal ring 21 surrounds the open end of the container 20 and forms a seal with the lid 10f of the IC-package. |
| 22 | Component 22 is a conduit which has |

TABLE 2-continued

| Component | Description |
|---|---|
| | two inputs that are connected to the vacuum ports P in the container 20, and which has one output. |
| 22a | Component 22a is a pressure relief valve, in the conduit 22, which can be manually opened to put the inside of the conduit at atmospheric pressure. |
| 22b | Component 22b is an isolation valve, in the conduit 22, which can be manually closed to block any flow through the conduit. |
| 22c | Component 22c is a vacuum control valve, in the conduit 22, which opens by a selectable amount in response to a control signal VSET. |
| 23 | Component 23 is a condenser/heat-exchanger which has an input port 23a that is coupled to the output of the conduit 22. |
| 24 | Component 24 is a vacuum pump which has an input 24a that is coupled to the output of the condenser/heat exchanger 23. |
| 25 | Component 25 is a control input by which an operator manually selects a particular sub-atmospheric pressure for the vacuum pump 24 to generate in the container 20. A signal VSET, from this control input, indicates the selected pressure and is sent to the vacuum control valve 22c. |
| 25a | Component 25a is a vacuum gauge which displays the actual sub-atmospheric pressure that is generated in the container 20. |
| 26 | Component 26 is a reservoir which has an input port 26a that is coupled to an output port on the vacuum pump 24. |
| 26b | Component 26b is an air vent, on the top of the reservoir 26, which enables air to escape from the reservoir and which places the liquid coolant in the reservoir at atmospheric pressure. |
| 27 | Component 27 is a liquid pump which has an input port 27a that is coupled to an output port on the reservoir 26. |
| 28 | Component 28 is a pressure regulator, for a liquid, which has an input port 28a that is coupled to an output port on the liquid pump 27. |
| 29 | Component 29 is a conduit which couples an output port 28b on the pressure regulator 28 to an internal channel in the bottom 20a of the container 20. This internal channel is hidden in FIG. 1, but is shown in FIG. 2. |
| 30 | Component 30 is replicated multiple times (eg - twenty to two-thousand times) on the bottom 20a of the container 20. Each component 30 is a bubble jet nozzle, like those which are in a printer for a computer. A liquid coolant is sent to each nozzle 30 from the conduit 29 and the internal channel in the bottom 20a of the container 20. |
| 31 | Component 31 is replicated multiple times, between the nozzles 30, on the bottom 20a of the container 20. Each component 31 is a window which |

TABLE 2-continued

| Component | Description |
|---|---|
| | passes IR-radiation (infrared radiation) but does not pass any liquid and vapor that is in the container 20. |
| 32 | Component 32 is a source of IR radiation which is coupled to the bottom 20a of the container 20. |
| 33 | Component 33 is a control signal generator for the nozzles 30 and the IR source 32. This control signal generator 33 receives the TEMP signal on a conductor 33a, and it receives set-point signals SP on a conductor 33b. In response to the TEMP and SP signals, the control signal generator produces two control signals CS1 and CS2. The control signals CS1 are sent on conductors 33c to the nozzles 30, and the control signals CS2 are sent on conductors 33d to the IR source 32. |
| 34 | Component 34 is a manual control input by which an operator selects a particular set-point temperature. The signal SP from the control input 34 indicates the selected set-point temperature. |

Now, the manner in which all of the components in TABLE 2 interact with an IC-package 10 will be described. Initially, one particular IC-package 10 which is to be tested is pressed against the seal ring 21, as shown in FIG. 1. Then an operator manually selects a particular set-point temperature via the control input 34, and selects a particular sub-atmospheric pressure via the control input 25. Thereafter, the valve 22b is opened. Then, after the selected sub-atmospheric pressure is reached inside of the container 20, electrical power PWR and electrical test signals TEST are applied to the conductors 10c and 10d from an external source (not shown). However, if the gauge 25a indicates that the selected sub-atmospheric pressure cannot be reached inside of the container 20 due to a leak past the seal ring 21, then the FIG. 1 system is shut down and corrective action is taken. This avoids any damage to the IC-module 10.

Whenever the TEST signals change from one stat to another, the amount of electrical power which is dissipated by the IC-chip 10a also changes. Consequently, the temperature of the IC-chip 10a tends to vary. However, the temperature at the IC-chip 10a is monitored by the control signal generator 33 via the TEMP signals. And, by properly generating the control signals CS1 and CS2, the control signal generator 33 is able to keep the temperature of the IC-chip 10a near the set-point temperature.

To remove heat from the IC-chip 10a, the control signal generator 33 sends the control signals CS1 to a selectable subset of the nozzles 30. Each nozzle that receives the control signal CS1 ejects one droplet of liquid against the cover 10f of the IC-package 10. Four ejected liquid droplets are indicated by the letter "L" in FIG. 1.

When an ejected liquid droplet L hits the cover 10f of the IC-package 10, heat is quickly transferred from the cover 10f to the liquid droplet L and that causes the droplet to vaporize. In FIG. 1, vaporized droplets are indicated by the letter "V".

All of the vaporized droplets are removed from the container 20 through the vacuum ports P. From those ports, the vaporized droplets travel through the conduit 22 to the condenser/heat-exchanger 23.

In the condenser/heat-exchanger 23, heat is removed from the vaporized droplets which converts them back to a liquid. Then the liquid from the condenser/heat-exchanger 23 travels through the vacuum pump 24 to the reservoir 26. From the reservoir 26, the liquid travels through the liquid pump 27, the pressure regulator 28, and the conduit 29 to the internal channel in the bottom 20a of the container 20.

To add heat to the IC-chip 10a, the control signal generator 33 sends the control signals CS2 to the IR-source 32. In response, the IR-source 32 emits infrared radiation as long as it receives the CS2 signal. That infrared radiation passes through the IR-windows 31 and hits the cover 10f of the IC-package 10. In FIG. 1, the infrared radiation is indicated by the dashed lines from the IR-windows 31.

Next, with reference to FIG. 2, additional details will be described regarding the nozzles 30 and IR-windows 31 which are on the bottom 20a of the container 20. FIG. 2 shows that the nozzles 30 and IR-windows 31 are interleaved in an array of rows and columns. In FIG. 2, there is room to illustrate only three rows and four columns; however, the actual array can have any number of rows and columns.

Each nozzle 30 in FIG. 2 receives liquid coolant from an internal channel which lies within the bottom 20a of the container 20. That internal channel is coupled to the conduit 29 in FIG. 1.

Each nozzle 30 in FIG. 2 also receives a separate control signal RiCj from the control signal generator 33 in FIG. 1. Here, "i" and "j" are indices 1, 2, 3, etc. Control signal RiCj is sent to the nozzle 30 in the i-th row and j-th column of the FIG. 2 array. All of the control signals RiCj together constitute the control signals CS1 in FIG. 1.

Each control signal RiCj is a voltage pulse (or a current pulse) of a predetermined width. When this pulse is received by a nozzle 30, the nozzle ejects a single droplet of the liquid coolant from its orifice 30a. The total amount of liquid coolant which is ejected against the lid 10f of the IC-package 10 is increased by increasing the number of control signals RiCj which are sent concurrently, and/or by increasing the repetition rate of the control signals.

All of the nozzles 30 in the FIG. 2 array, as well as all of the conductors that carry the control signals RiCj and all channels that carry the liquid coolant, are integrated onto one surface of a planar substrate (not shown). The IR-source 32 is attached to the opposite surface of the planar substrate. That substrate is made of a material such as glass which is essentially transparent to radiation from the IR-source 32. The IR-windows 31 are defined by portions of the substrate that lie between the nozzles 30, through which none of the conductors for the control signals RiCj, and none of the internal channels for the liquid coolant, are routed.

Referring now to FIGS. 3A–3D, an example will be described which illustrates how the signal generator 33 uses the nozzles 30 and IR-windows 31 of FIG. 2 to maintain the temperature of the IC-chip 10a near the set point while the power dissipation by the IC-chip varies. In each of the FIGS. 3A–3D, one complete array of nozzles 30 and IR-windows 31 shown. Also, each particular nozzle 30 which is ejecting coolant droplets is shown by the letter "C" in a circle, whereas each nozzle 30 which is not ejecting coolant droplets is shown by the letter C without a circle. Similarly, each particular IR-window 31 which is passing energy as infrared radiation is shown by the letter "H" in a circle, whereas each IR-window 31 which is not passing energy is shown by the letter H without a circle.

Assume now that th IC-chip 10a, in the FIG. 1 temperature regulating system, is dissipating 100 watts of power. In that case, to keep the temperature of the IC-chip 10a constant, the amount of liquid coolant which is ejected from the nozzles 30 must remove 100 joules of heat per second from the IC-chip 10a. This is shown in FIG. 3A as being achieved by ejecting coolant droplets, at a predetermined rate, from the subsets of nozzles 30 which are shown by "C" in a circle.

Next, assume that the power which the IC-chip 10a is dissipating increases from 100 watts to 200 watts. Then, to keep the temperature of the IC-chip 10a constant, the amount of liquid coolant which is ejected from the nozzles 30 must remove 200 joules of heat per second from the IC-chip 10a. This is shown in FIG. 3B as being achieved by doubling the number of nozzles 30 which are ejecting coolant droplets over that which is shown in FIG. 3A, and keeping the ejection rate constant.

Next, assume that the power which the IC-chip 10a is dissipating decreases to zero watts. Then, to keep the temperature of the IC-chip 10a constant, the ejection of liquid coolant from each nozzle 30 must be stopped, and all heat which the IC-chip 10a looses (such as by conduction cooling to the substrate 10b) must be replaced by infrared radiation through the IR-windows 31. This is shown as being achieved in FIG. 3C. There, the amount of heat which is added to the IC-chip 10a is increased (or decreased) by increasing (or decreasing) the ON to OFF ratio of the control signal CS2 to the IR-source 32.

The ON/OFF ratio of the control signal CS2 can be varied by generating the CS2 signal as a series of pulses at a fixed frequency and varying th width of each pulse. Alternatively, the width of each pulse can be fixed and the pulse frequency can be varied. Also, the IR-source 32 can have any internal structure which enables it to emit radiation in response to the pulses in the CS2 signal. For example, the IR-source 32 can include a quartz lamp which is always on, and further include a shutter which only opens while a CS2 pulse is present.

Figure 3D:
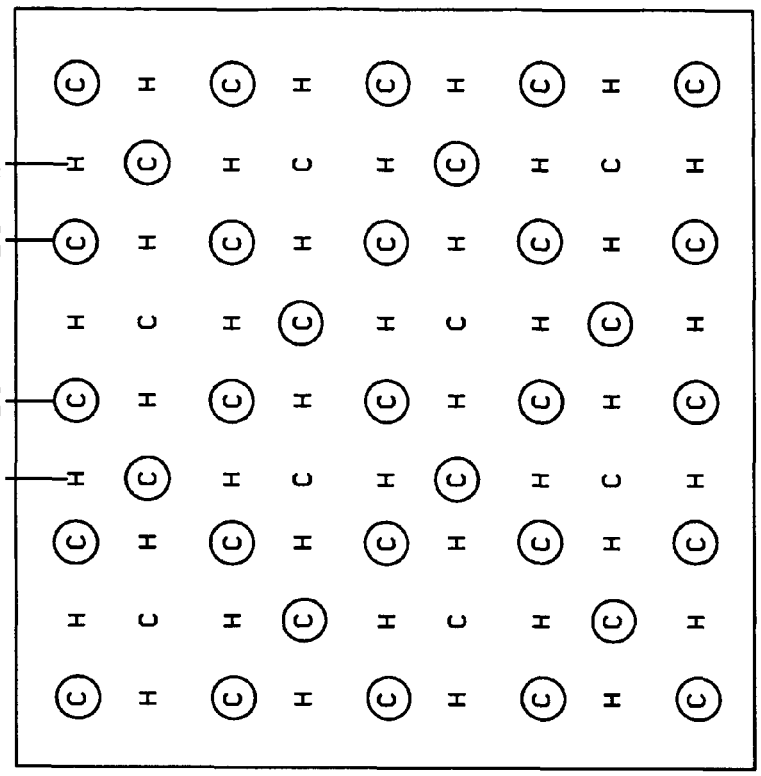
Figure 3C:
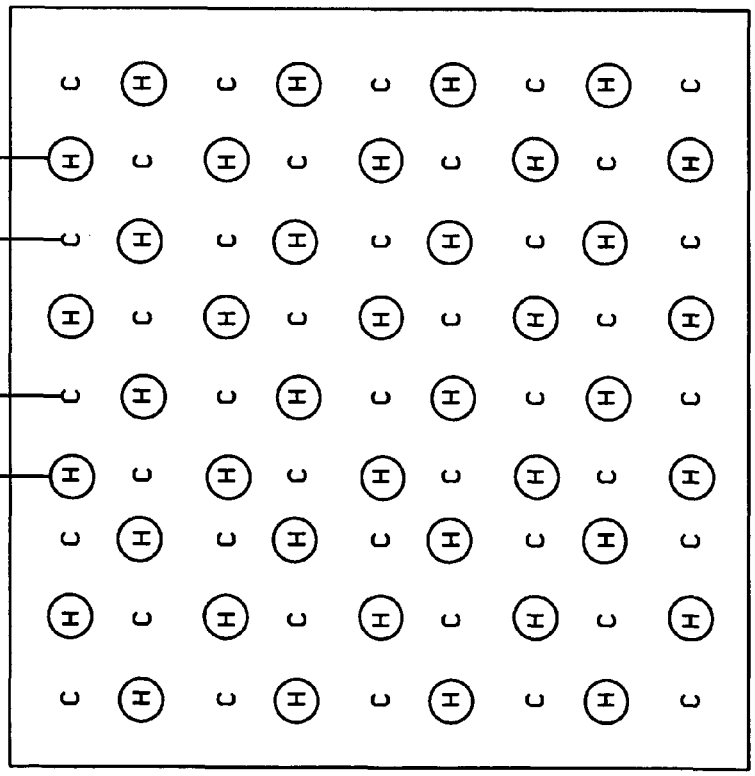

Next, assume that the power which the IC-chip 10a is dissipating increases to 300 watts. In that case, to keep the temperature of the IC-chip 10a constant, the amount of liquid coolant which is ejected from the nozzles 30 must remove 300 joules of heat per second from the IC-chip 10a. This is shown in FIG. 3D as being achieved by ejecting coolant droplets from a number of nozzles 30 that equals those which eject coolant in FIG. 3A and FIG. 3B combined, while keeping the ejection rate constant.

Now, with reference to FIG. 4, some additional details will be provided regarding the structure of the array of nozzles 30 and IR-windows 31 in FIG. 2. In FIG. 4, equation 1 indicates that the volume of a single drop of liquid coolant which is ejected from one of the nozzles 30 in FIG. 2 is ten picoliters, as one practical example. This volume has a weight of ten nanograms when the liquid coolant is water.

Equation 2 in FIG. 4 calculates the amount of heat $\Delta Q$ which can be removed from the IC-chip 10a in FIG. 1 by the single drop of water in equation 1. The result of that calculation is $\Delta Q$ approximately equals twenty micro joules per drop. In equation 2, $\Delta T$ is the difference between the temperature at which the water droplet vaporizes and its initial temperature when it is ejected from the nozzle 30, and Cp is the specific heat of water. Also in equation 2, the term of 2260 joules per gram is the heat of vaporization for water. The heat of vaporization is significantly larger than the term $(\Delta T)(Cp)$, and so as a rough approximation, the term $(\Delta T)(Cp)$ can be ignored.

Suppose now that the maximum rate at which heat needs to be removed from an IC-chip 10a is 400 joules per second. Then, equation 3 in FIG. 4 expresses that requirement in terms of the heat per drop from equation 2, the total number of nozzles 31 in the FIG. 2 array, and the frequency with which pulses are sent to any one nozzle 30 via the control signals RiCj.

One particular frequency for the pulses in the control signals RiCj is 10 KHz. This is stated by equation 4. Then, substituting 10 KHz into equation 3 and solving for the total number of nozzles 30 in the array yields a result of 2000.

Assume now that the lid 10f on the IC-package 10 has a square area that is available for heat transfer which is one inch on a side. For such a lid, 2000 of the nozzles 30 may be fabricated in a square array which has forty-five rows and forty-five nozzles per row. This is stated by equation 5.

When forty-five of the nozzles 30 are equally spaced in each row, then the center-to-center spacing of those nozzles 30 is 560 micrometers. This is derived by equation 6.

A single nozzle in a present day inkjet printer occupies an area of less then fifty by one-hundred micrometers. This area is stated in equation 7. Such nozzles would easily fit in the array of FIG. 2 where there spacing is 560 micrometers.

Also in the array of FIG. 2, there must be room for one of the IR-windows 31 between any two consecutive nozzles 30 in a row. Each IR-window 31 only needs to be larger then the wavelength of infrared radiation in order to pass that radiation, and the wavelength of infrared radiation ranges from one to ten micrometers. Thus a large IR-window 31 of twenty-by-twenty micrometers, as indicated by equation 7, will easily fit between the nozzles 30 which are spaced by 560 micrometers.

Figure 5B:
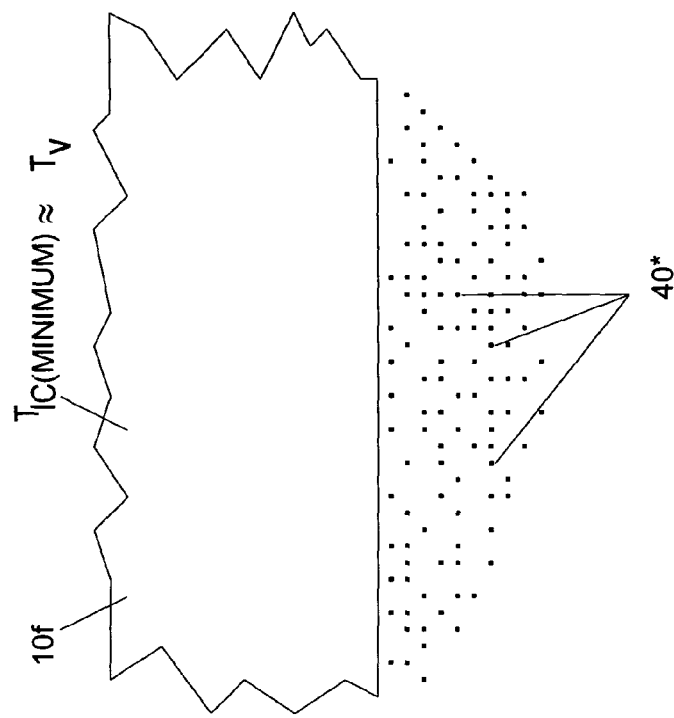
FIG. 5B illustrates another particular benefit which is obtained with the FIG. 1 temperature regulating system.
Figure 5A:
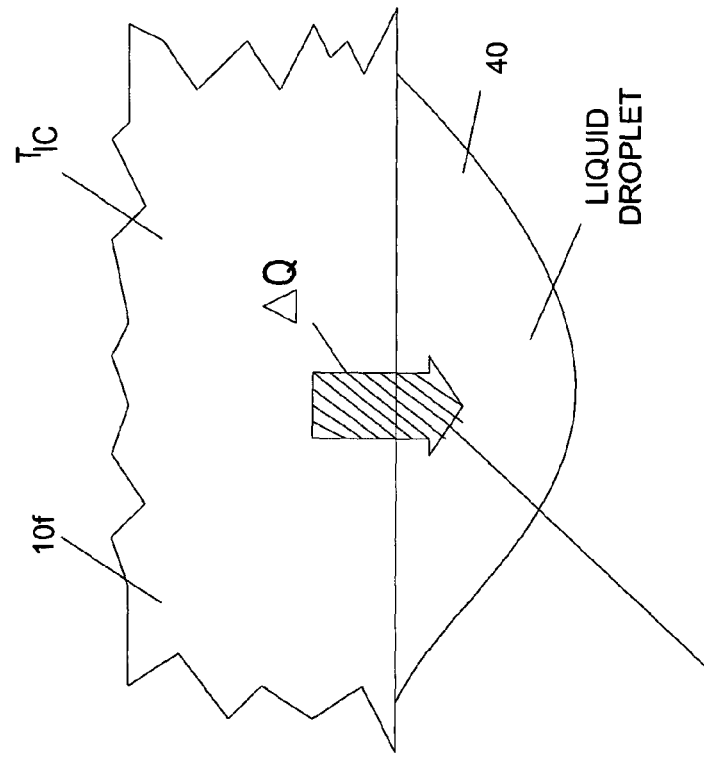
FIG. 5A illustrates one particular benefit which is obtained with the FIG. 1 temperature regulating system.

Turning next to FIGS. 5A–5B, three particular benefits which are obtained by the FIG. 1 system, will be described. In FIG. 5A, reference numeral 40 identifies a single droplet which has been ejected by one of the nozzles 30 against a portion of the lid 10f.

While the droplet 40 is against the lid 10f, the heat of vaporization is transferred from the lid 10f to the droplet 40. That heat transfer occurs while the droplet is at a temperature $T_V$, and it occurs in a time period $\Delta t$ which decreases as the difference between $T_{IC}$ and $T_V$ increases. Here, $T_{IC}$ is the surface temperature of the lid 10f of the IC-package 10, and $T_V$ is the temperature at which the droplet 40 changes from a liquid to a vapor.

By maintaining the inside of the container 20 at a sub-atmospheric pressure, the temperature $T_V$ is reduced. This increases the difference $T_{IC}-T_V$, and so the heat flux $\Delta Q/\Delta t$ which flows into each droplet is increased from that which would otherwise occur if the pressure in the container 20 were at, or above, atmospheric pressure.

In FIG. 5B, reference numeral 40* identifies the droplet 40 from FIG. 5A after it has vaporized. When the total number of droplets that are vaporized per second, times the heat of vaporization per droplet, is more than the power which the IC-chip 10a is dissipating, then the temperature of the IC-chip 10a gets reduced. However, the minimum temperature to which the IC-chip 10a can be reduced is just slightly above the temperature where the droplet 40 vaporized. Thus, in the FIG. 1 system, the lowest temperature at which the IC-chip 10c can be maintained is lower than that which would otherwise occur if the pressure in the container 20 were at, or above, atmospheric pressure.

Preferably, the sub-atmospheric pressure inside of the container 20 is kept at a point where essentially each liquid coolant droplet that is ejected from each nozzle rapidly vaporizes as soon as it hits the IC-module. Also preferably, the sub-atmospheric pressure inside of the container 20 is kept at a point where the boiling point of the liquid coolant is lowered by at least 10° C. from its boiling point at atmospheric pressure.

Further in the FIG. 1 system, the sub-atmospheric pressure which is created by the vacuum pump 24 makes the seal ring 21 (as well as the container 20 and the conduit 22) leak tolerant. If a leak occurs between the seal ring 21 and the lid 10f of the IC-module 10, air will get sucked into the container 20, but that air can get purged from th system. By comparison, if the vacuum pump 24 was eliminated and th pressure inside of the container 20 was positive, liquid coolant would squirt out from any leak between the seal ring 21 and the lid 10f, and that could cause an electrical short between the conductors 10c, 10d, and 10e on the substrate 10b.

After one particular IC-module 10 has been tested in the system of FIGS. 1–5B, that IC-module is removed and replaced with another IC-module, which is then tested. This sequence is repeated over and over as desired. To aid in the removal of each IC-module, the isolation valve 22b is closed, and then the pressure relief valve 22a is opened. This enables the inside of the container 20 to be quickly returned back to atmospheric pressure before the IC-module 10 is separated from the seal ring 21.

One preferred embodiment of a temperature regulating system which incorporates the present invention has now been described in detail. Next, with reference to FIG. 6, a second embodiment will be described. This second embodiment is the same as the embodiment of FIGS. 1–5B except that the array of nozzles 30 and IR-windows 31, as shown in FIG. 6, replaces the previously described array of FIG. 2.

Figure 6:
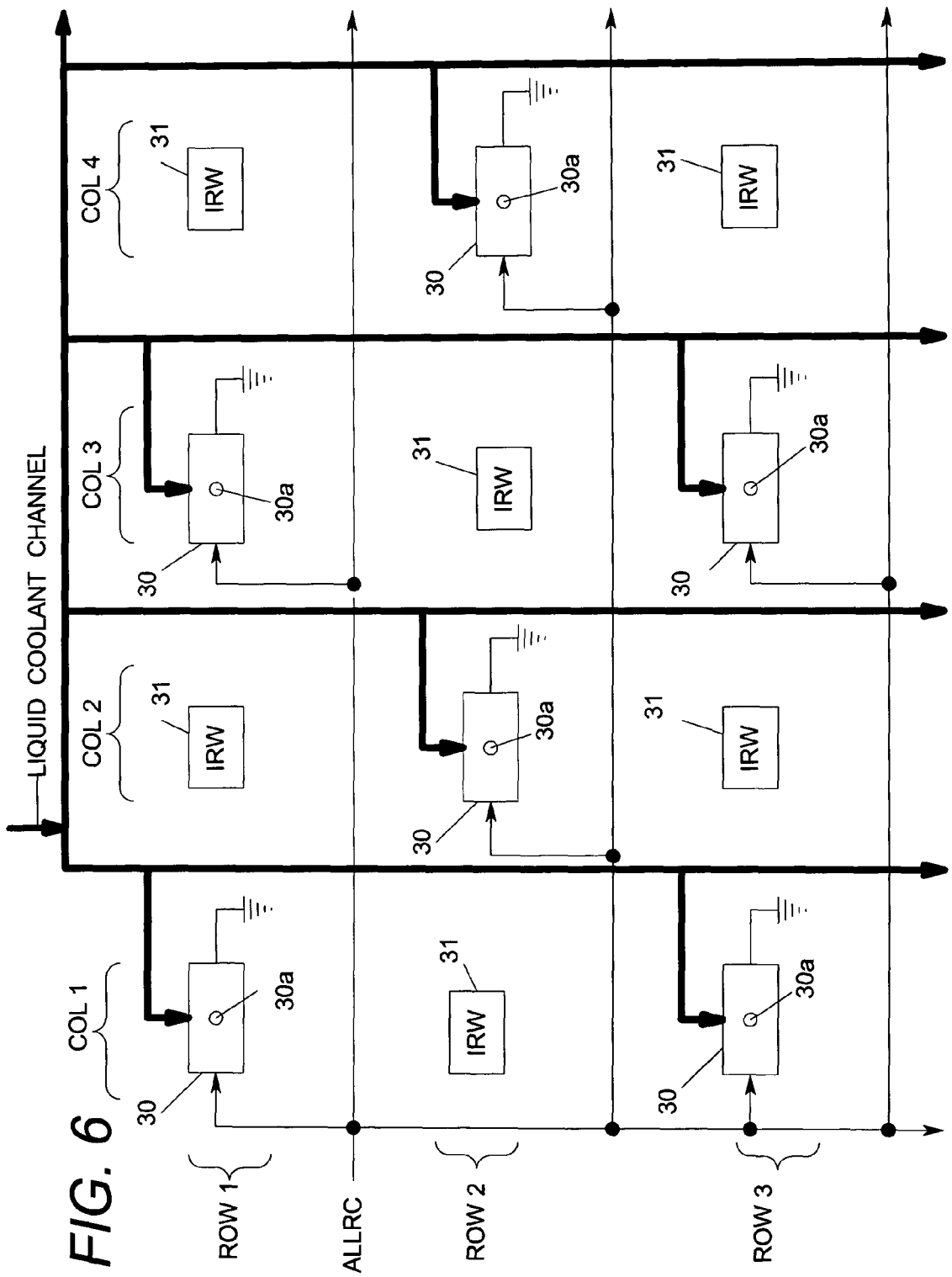
FIG. 6 shows one alternative array of nozzles and IR-windows which can replace the FIG. 2 array in the FIG. 1 temperature control system.

The difference between the arrays of FIG. 6 and FIG. 2 is that in FIG. 6, a single control signal ALLRC is sent to all of the nozzles 30, whereas in FIG. 2, a separate control signal RiCj was sent to each nozzle. Thus in FIG. 6, the conductors that carry the signal ALLRC occupy substantially less space than the conductors in FIG. 2 that carry the signals RiCj.

With the modified array of FIG. 6, all of the nozzles 30 eject one coolant droplet in response to each pulse in the control signal ALLRC. To increase (or decrease) the amount of heat that is removed per second from the IC-chip 10a, the frequency of the pulses in the control signal ALLRC is increased (or decreased). The particular frequency at any time instant is selected by the control signal generator 33 in FIG. 1 which generates the control signal CS1 as signal ALLRC.

When the temperature of the IC-chip 10a, as indicated by the TEMP signal, equals the set-point temperature, then the control signal generator 33 holds the frequency of the pulses in the ALLRC signal constant at its current rate. If the temperature of the IC-chip 10a starts to increase above the set point, then the control signal generator 33 increases the frequency of the pulses in the ALLRC signal. Conversely, if the temperature of the IC-chip 10a starts to decrease below the set point, then the control signal generator 33 decreases the frequency of the pulses in the ALLRC signal. When the frequency of the pulses in the ALLRC signal is decreased to zero, then the control signal generator 33 adds heat to the IC-chip 10a by sending control signal CS2 to the IR-source 32, as was previously described in conjunction with FIG. 3C.

Next, with reference to FIGS. 7A–7C, a third embodiment of a temperature regulating system which incorporates the present invention will be described. This third embodiment is the same as the embodiment of FIGS. 1–5B except that the array of nozzles 30 and IR-windows 31', as shown in FIGS. 7A–7C, replaces the previously described array of FIG. 2.

Figure 7C:
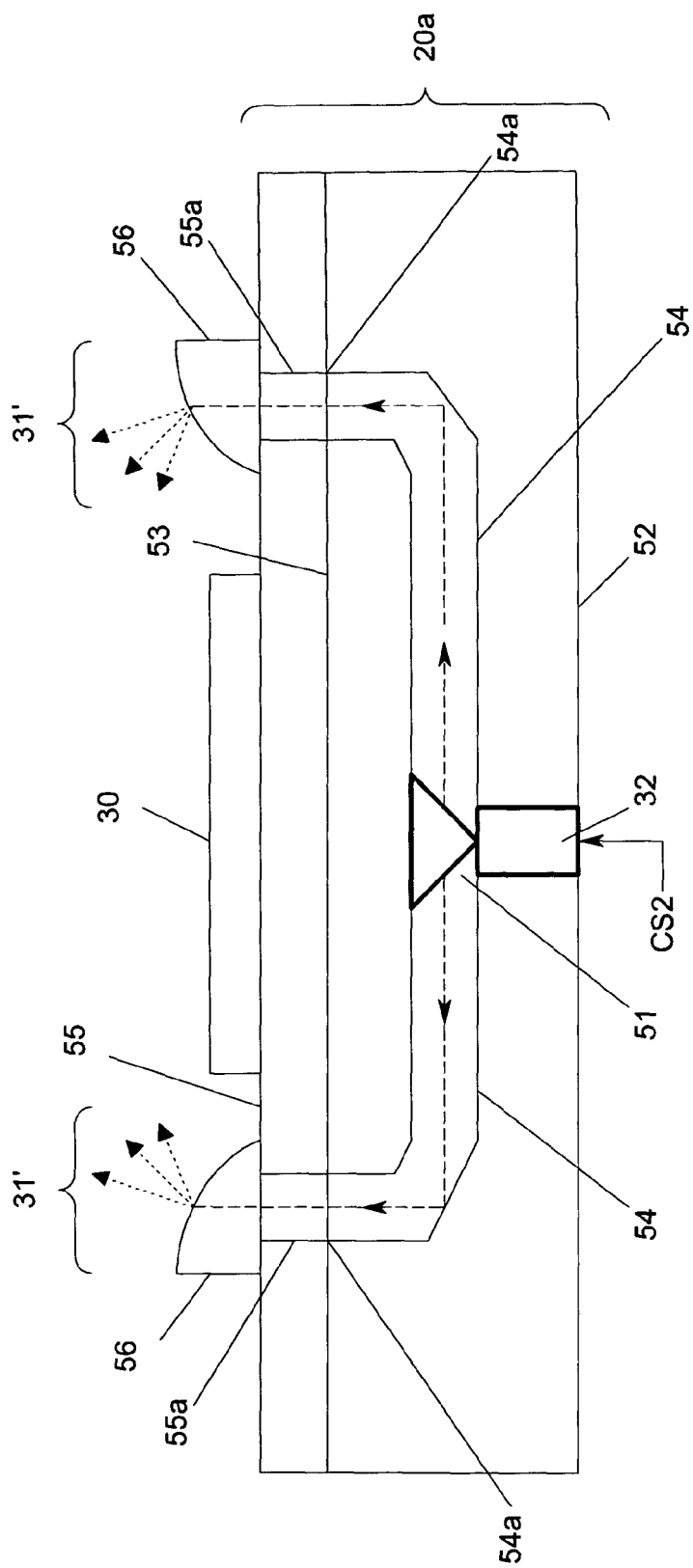
FIG. 7C shows further details of the array in FIG. 7A.

One difference between th arrays of FIG. 2 and FIGS. 7A–7C is that in FIGS. 7A–7C, the nozzles 30 are clustered together and are surrounded by four enlarged IR-windows 31', whereas in FIG. 2, the nozzles 30 and IR-windows 31 are interleaved. Also in the array of FIGS. 7A–7C, the single control signal ALLRC is sent to all of the nozzles 30, just like the ALLRC control signal in FIG. 6.

By separating the IR-windows 31' from the nozzles 30, as shown in FIGS. 7A–7C, all radiation from the IR-source 32 can be directed by optical components away from the cluster of nozzles 30 and through the IR-windows 31'. Thus in the array of FIGS. 7A–7C, the maximum power level which can be radiated by the IR-source 32, without·3 imaging the nozzles 30 or their operation, is increased over the array of FIG. 2.

FIG. 7C shows one particular structure for the bottom 20a of the container 20 which includes optical components that direct radiation, emitted by the IR-source 32, around the nozzles 30. Component 51 in FIG. 7C is a pyramid-shaped mirror. Radiation from the IR-source 32 is deflected by the mirror 51 into four beams which are perpendicular to each other. Two of those beams are shown in FIG. 7C as dashed lines, and the other two beams (not shown) are perpendicular to the plane of FIG. 7C.

Components 52 and 53 in FIG. 7C together form four hollow passageways 54 in which the radiation from the mirror 51 travels. Each passageway 54 has reflective sidewalls which direct the radiation to the open ends 54a of the passageway.

Component 55 in FIG. 7C is a planar substrate. The array of nozzles 30 as shown in FIG. 7B is fabricated on the top surface of the substrate 55, and components 52 and 53 are subsequently attached with an adhesive to the bottom surface of the substrate 55. Four holes 55a extend through the substrate 55 in alignment with the open ends 54a of the passageways 54.

All of the holes 55a in the substrate 55 are covered by a respective lens 56. Each lens 56 is shaped to spread the radiation that it receives into the region over the array of nozzles 30 where the IC-chip 10a is held. Alternatively, all of the holes 55a can be plugged with a material which passes the radiation, and a mirror can be located near each hole to direct the radiation into the region where the IC-chip 10a is held.

Figure 8A:
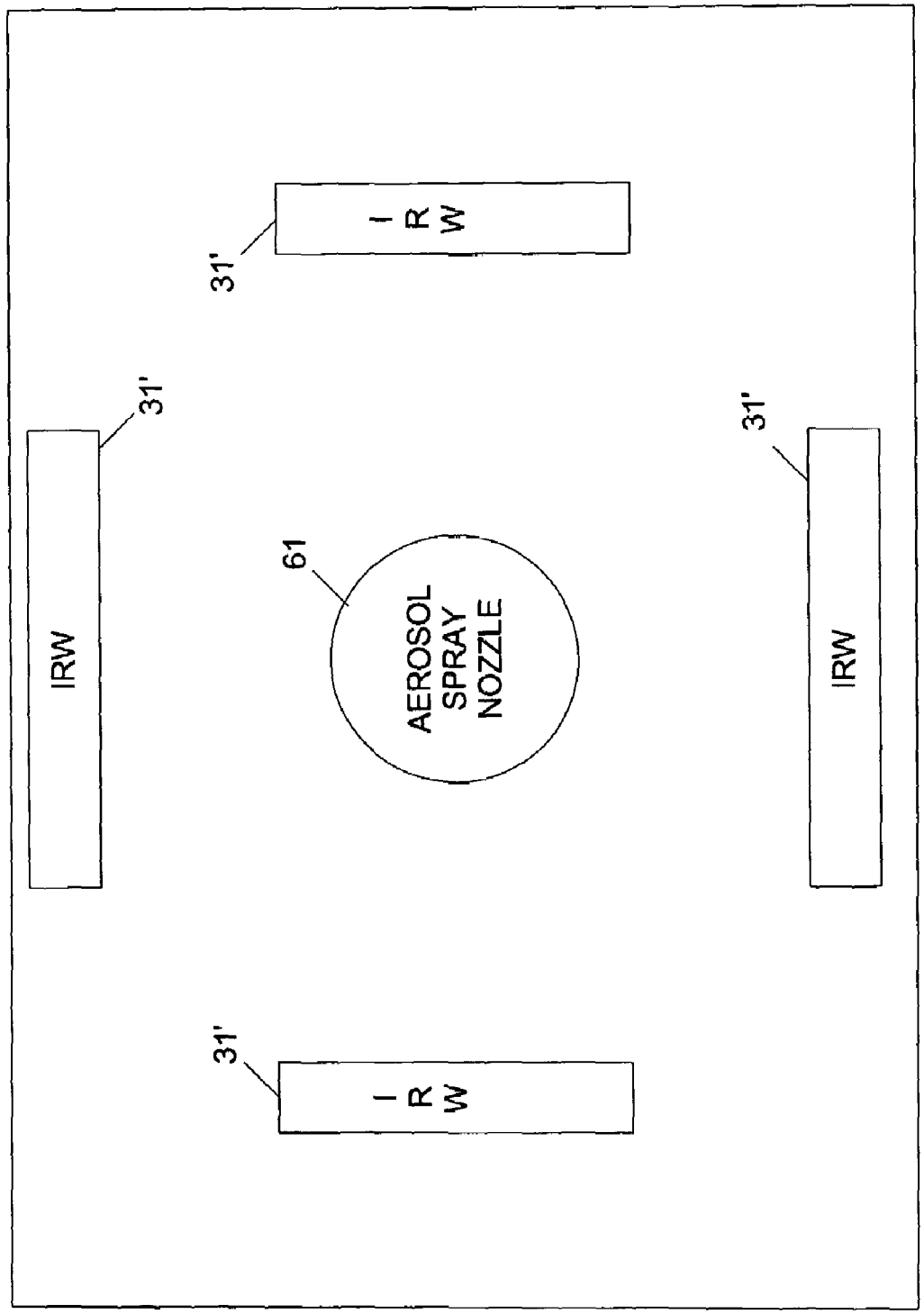
FIG. 8A shows a third alternative array of nozzles and IR-windows which can replace the FIG. 2 array in the FIG. 1 temperature control system.

Next, with reference to FIGS. 8A and 8B, a fourth embodiment of a temperature regulating system which incorporates the present invention will be described. This fourth embodiment is the same as the embodiment of FIGS. 1–5B except that a single aerosol spray nozzle 61 which is surrounded by four enlarged IR-windows 31', as shown in FIG. 8A, replaces the array of nozzles 30 and IR-window 31 that are shown in FIG. 2.

The aerosol spray nozzle 61 receives liquid coolant from the conduit 29 in FIG. 1, and it continuously ejects multiple droplets of the liquid coolant as long as the control signal CS1 is in an "ON" state. Those coolant droplets are ejected in a cone-shaped pattern onto the IC-package 10, which in FIG. 1 is pressed against the seal ring 21.

Preferably, the control signal generator 33 generates the control signal CS1 as a series of pulses which occur at a fixed frequency. To increase (or decrease) th amount of heat that is removed per second from the IC-chip 10a, the width of the pulses in the control signal CS1 is increased (or decreased). The particular pulse width at any time instant is selected by the control signal generator 33.

Alternatively, the control signal generator 33 generates the control signal CS1 as a series of pulses which have a fixed pulse width. To increase (or decrease) the amount of heat that is removed per second from the IC-chip 10a, the frequency of the pulses in the control signal CS1 is increased (or decreased). The particular frequency at any time instant is selected by the control signal generator 33.

To direct the radiation which is emitted by IR-source 33 away from the aerosol spray nozzle 61, the previously described structure of FIG. 7C may be used with one modification wherein the array of nozzles 30 is replaced with the aerosol nozzle 61. Alternatively, th structure which is shown in FIG. 8B may be used.

Figure 8B:
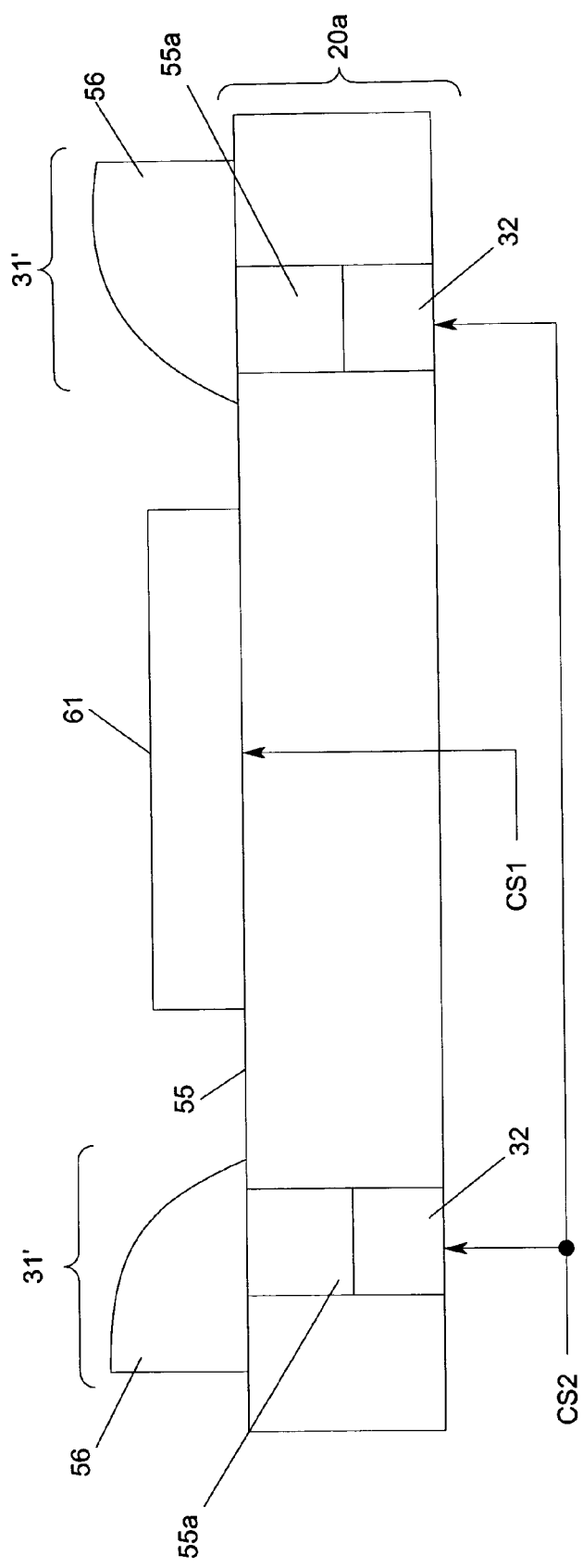
FIG. 8B shows additional details of the array in FIG. 8A.

In FIG. 8B, the substrate 55 and four lenses 56 from FIG. 7C are retained. Also, a separate IR-source 32 is provided in each of the four holes 55a in th substrate 55 that are aligned with the lens 56. Control signal CS2 is sent to all four of the IR-sources 32.

Next, a modification will be described which can be made to any one of the embodiments of FIGS. 1–5B, FIG. 6, FIGS. 7A–7C, and FIGS. 8A–8B. For all of those embodiments, FIG. 1 shows that the sidewall 20b of th container 20 squeezes the seal ring 21 against the lid 10f of the IC-package 10. However, as a modification, the sidewall 20b can squeeze th seal ring 21 directly against the IC-chip 10a.

Figure 9:
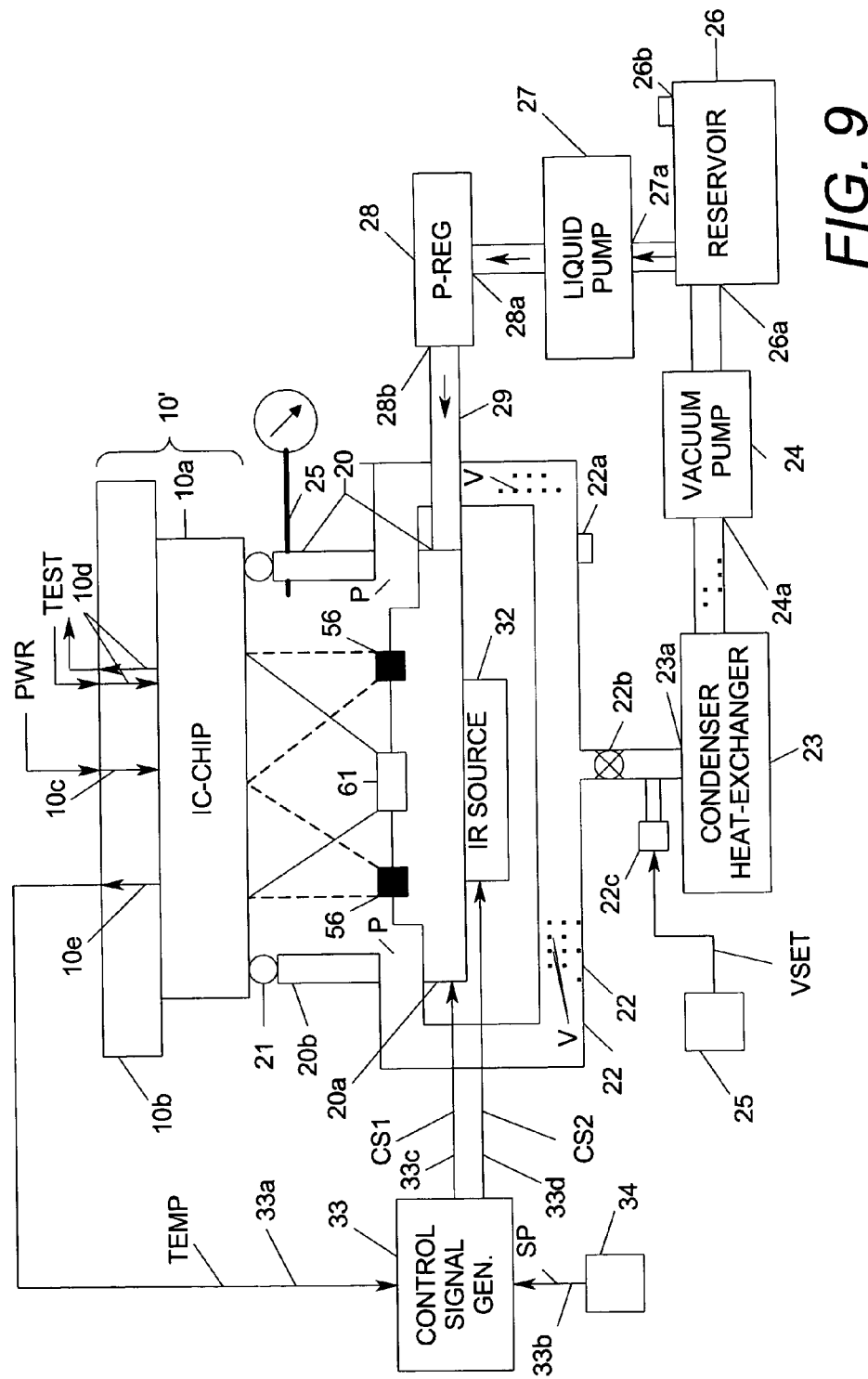
FIG. 9 shows the temperature control system of FIG. 1 incorporating the alternative array of FIGS. 8A–8B and operating on a bare IC-chip which is mounted on a substrate.

One example of the above modification is shown in FIG. 9. There, the IC-package 10' is the same as the IC-package 10 in FIG. 1 except that the lid 10f and thermal interface material 10g are eliminated. Also in FIG. 9, the bottom 20a of the container 20 is shown as having the structure that was previously described in conjunction with FIGS. 8A–8B. Alternatively, the bottom 20a of the container 20 can have the structure that was previously described in conjunction with FIG. 2, or FIG. 6, or FIGS. 7A–7B.

Next, a modification will be described which can be made to the embodiment of FIGS. 7A–7C. For that embodiment, FIG. 7B, shows that all of the nozzles 30 eject one droplet of liquid coolant in response to a single control signal ALLRC. However as a modification, each of the nozzles 30 in FIG. 7B can be sent a separate control signal RiCj, as is shown in FIG. 2.

Next, a modification will be described which can be made to the embodiment of FIGS. 8A–8B. In each of the FIGS. 8A and 8B, only a single aerosol spray nozzle 61 is shown. However as a modification, two (or more) aerosol spray nozzles 61 can be held by the substrate 55 between the lenses 56. Also, the same control signal can be sent to all of the aerosol spray nozzles 61 to turn all of them on, or the aerosol spray nozzles 61 can be sent separate control signals.

Next, a modification will be described which can be made to any one of the embodiments of FIGS. 1–5B, FIG. 6, or FIGS. 7A–7C. For all of those embodiments, each nozzle 30 was described as a bubble-jet nozzle, like those which are in a printer for a computer. A bubble-jet nozzle ejects a liquid droplet by hating it with an electric resistor. However as a modification, each nozzle 30 can be a piezoelectric device which ejects a droplet by squeezing the droplet out of an orifice. Such a piezoelectric device is currently used in Epson printers for digital computers.

Next, a modification will be described which can be made to any one of the embodiments of FIGS. 1–5B, FIG. 6, FIGS. 7A–7C, and FIGS. 8A–8B. For all of those embodiments, FIG. 1 includes an IR-source 32 on the bottom 20a of the container 20. However, when some particular types of the IC-chips 10a are tested, the electrical power dissipation in the IC-chip never reaches zero. Consequently, to test those types of IC-chips 10a, the IR-source 32 and the IR-windows 31–31' can be eliminated from the embodiments of FIGS. 1–5B, FIG. 6, FIGS. 7A–7C, and FIGS. 8A–8B.

Next, another modification will be described which also can be made to any one of the embodiments of FIGS. 1–5B, FIG. 6, FIGS. 7A–7C, and FIGS. 8A–8B. For all of those embodiments, FIG. 1 includes a vacuum pump 23 which keeps the inside of the container 20 at a sub-atmospheric pressure. That in turn reduces the minimum temperature at which the IC-chip 10a can be maintained, and increases the speed at which each liquid droplet vaporizes, as was previously described in conjunction with FIGS. 5A–5B.

However, when some particular types of tests are performed on the IC-chips 10a, the set-point temperature is so high that a sub-atmospheric pressure inside of the container 20 is not needed. Consequently, to perform those tests, the vacuum pump 24 can be eliminated from th embodiments of FIGS. 1–5B, FIG. 6, FIGS. 7A–7C, and FIGS. 8A–8B. Then, the vaporized droplets in the container 20 pass through the conduit 22 and the condenser/heat-exchanger 23 under a positive pressure which is created by the liquid pump 27 and the vapor itself.

Next, a modification will be described which can be made to the calculations that are shown by equations 1–7 in FIG. 4. There, the pulses in the control signals RiCj are set by equation 4 and occur with a frequency of ten-thousand pulses per second. However, that is just one specific example. A practical range for the frequency that can be set by equation 4 is 500 Hz to 500 KHz.

Next, a modification will be described which can be made to the IR-windows 31 and 31' that are shown in FIGS. 1, 2, 3A–3D, 6, 7A, 7C, 8A, 8C, and 9. Those windows pass infrared radiation from the IR-source 32 into the container 20 and onto the IC-module 10. But as a modification, the IR-source 32 can be replaced by a substitute source (such as a laser) which radiates electromagnetic energy in a frequency band other than the infrared band. In that case, the IR-windows 31 and 31' would be modified to pass the energy which the substitute source radiates.

Next, a modification will be described which can be made to any one of the embodiments of FIGS. 1–5B, FIG. 6, FIGS. 7A–7C, and FIGS. 8A–8B. For all of those embodiments, FIG. 1 shows that only a single container 20 is connected by the conduit 22 to the condenser/heat-exchanger 23. However, as a modification, multiple copies of the container 20 can have their vacuum ports P connected by on conduit to the condenser/heat-exchanger 22. In that case, the output of the pressure regulator 28 would be connected by another conduit to the internal channel for the liquid coolant in the bottom 20c of each container 20.

When the above modification is made, each container 20 will hold a separate IC-module 10 as shown in either FIG. 1 or FIG. 8. Also, the control signal generator 33 will concurrently generate separate control signals CS1 and CS2 for each IC-module 10 in response to a separate TEMP signal from each IC-module.

Next, another modification will be described which also can be made to any one of the embodiments of FIGS. 1–5B, FIG. 6, FIGS. 7A–7C, and FIGS. 8A–8B. For all of those embodiments, the description of FIG. 1 indicated that the set-point temperature is selected when the testing of an IC-chip begins and remains constant throughout the test. However, as a modification, the set-point temperature can be changed by the control input 34 at any time while an IC-chip is tested.

If the set-point temperature is changed while an IC-chip is being tested, each of the above embodiments of the temperature control system will respond very quickly to change the temperature of the IC-chip to the new set point. This quick response occurs because the amount of heat which is removed from the IC-chip by the coolant droplets, and the amount of heat which is added to the IC-chip through the IR-windows, can be quickly increased or decreased as was previously described in conjunction with FIGS. 3A–3D and FIGS. 5A–5B.

Next, a modification which can be made to the temperature regulating system of FIGS. 8A–8B will be described. In that embodiment, the control signal CS1 is sent to the aerosol spray nozzle 61 to thereby increase or decrease the amount of liquid coolant that is sprayed onto the IC-module 10. However, as a modification, the control signal CS1 can be sent to the pressure regulator 28 in FIG. 1. In that case, the pressure regulator 28 would be structured to increase or decrease the pressure at which it sends the liquid coolant to the aerosol spray nozzle, in response to the control signal CS1.

Multiple embodiments of the present invention and multiple modifications thereto have now been described in detail. Accordingly, it is to be understood that the present invention is not limited to just the details of any one particular embodiment, but is defined by the appended claims.

What is claimed is:

1. A system for maintaining an IC-module under test near a constant set-point temperature while electrical power dissipation in said IC-module is varied; said system being comprised of:
   a container having an open end with a seal for pressing against said IC-module while said IC-module is under test, said container being detachable from said IC-module;
   at least one nozzle, in said container, for spraying a liquid coolant on said IC-module when said seal is pressed against said IC-module;
   a vacuum pump coupled to said container, for producing a sub-atmospheric pressure between said container and said IC-module when said seal is pressed against said IC-module during testing; and
   a pressure regulator for maintaining said sub-atmospheric pressure while the temperature of said IC-module is kept near said set-point.

2. A system according to claim 1 wherein said pressure regulator reduces said sub-atmospheric pressure to a point where said liquid coolant from each nozzle rapidly vaporizes when it hits said IC-module.

3. A system according to claim 2 which further includes a circulation subsystem, coupled to each nozzle, that holds said liquid coolant; and wherein said liquid coolant consists essentially of water.

4. A system according to claim 2 which includes multiple nozzles at spaced-apart locations in said container, and each nozzle includes a means for receiving one control signal and a means for ejecting just a single droplet of said liquid coolant when it receives said one control signal.

5. A system according to claim 4 which further includes a closed-loop control means for: a) receiving a sensor signal representing a sensed temperature of said IC-module, and b) sending said control signal to all of said nozzles simultaneously with a frequency that increases as the differences between said sensed temperature and said set-point increases.

6. A system according to claim 4 which further includes a closed-loop control means for: a) receiving a sensor signal representing a sensed temperature of said IC-module, b) sending said control signal to a subset of said nozzles simultaneously, and c) increasing the number of nozzles in said subset as the difference between said sensed temperature and said set-point increase.

7. A system according to claim 4 wherein said means for ejecting in each nozzle ejects said single droplet by squeezing said coolant with a piezoelectric device.

8. A system according to claim 4 wherein said means for ejecting in each nozzle ejects said single droplet by heating said coolant with an electric heater.

9. A system according to claim 2 wherein each nozzle includes a means for receiving one control signal and a means for spraying multiple droplets of said liquid coolant when it receives said one control signal.

10. A system according to claim 9 which further includes a closed-loop control means for: a) receiving a sensor signal representing a sensed temperature of said IC-module, and b) sending said control signal with an ON-OFF ratio that increases as the difference between said sensed temperature and said set-point increases.

11. A system according to claim 2 wherein said seal is shaped to encircle a surface on said IC-module which encloses an IC-chip.

12. A system according to claim 2 wherein said seal is shaped to encircle an exposed surface on an IC-chip in said IC-module.

13. A system according to claim 1, wherein said pressure regulator maintains said sub-atmospheric pressure such that the boiling point of said liquid coolant is lower by at least 10°C. from its boiling point at atmospheric pressure.

14. A system according to claim 10, wherein said system maintains said IC-module near a constant set-point temperature while said IC-module is under test.

15. A system for maintaining an IC-module near a set-point temperature while electrical power dissipation in said IC-module is varied; said system being comprised of:
  a container having an open end with a seal for pressing against said IC-module;
  a closed loop cooling system to remove heat from said IC-module comprising:
  at least one nozzle, in said container, for spraying a liquid coolant on said IC-module when said seal is pressed against said IC-module;
  a condenser coupled to the container to receive and condense vaporized coolant from the container;
  a vacuum pump coupled to said container, for producing a sub-atmospheric pressure between said container and said IC-module when said seal is pressed against said IC-module; and
  a pressure regulator for maintaining said sub-atmospheric pressure while the temperature of said IC-module is kept near said set-point;
  one or more heating elements to add heat to said IC-module when the power dissipated by said IC-module decreases by an amount that would cool said IC-module below said set point;
  a controller configured to control said closed loop cooling system and said one or more heating elements to maintain the temperature of said IC-module at or near said set point.

16. A system according to claim 15 wherein said pressure regulator reduces said sub-atmospheric pressure to a point where said liquid coolant from each nozzle rapidly vaporizes when it hits said IC-module.

17. A system according to claim 16, wherein said liquid coolant consists essentially of water.

18. A system according to claim 15, which includes multiple nozzles at spaced-apart locations in said container, and each nozzle includes a means for receiving a control signal from said controller and a means for ejecting just a single droplet of said liquid coolant when it receives said control signal.

19. A system according to claim 18, wherein said controller is configured to: a) receive a sensor signal representing a sensed temperature of said IC-module, and b) send said control signal to all of said nozzles simultaneously with a frequency that increases as the differences between said sensed temperature and said set-point increases.

20. A system according to claim 18, wherein said controller is configured to: a) receive a sensor signal representing a sensed temperature of said IC-module, b) send said control signal to a subset of said nozzles simultaneously, and c) increase the number of nozzles in said subset as the difference between said sensed temperature and said set-point increase.

21. A system according to claim 18 wherein said means for ejecting in each nozzle ejects said single droplet by squeezing said coolant with a piezoelectric device.

22. A system according to claim 18 wherein said means for ejecting in each nozzle ejects said single droplet by heating said coolant with an electric heater.

23. A system according to claim 15 wherein each nozzle includes a means for receiving one control signal and a means for spraying multiple droplets of said liquid coolant when it receives said one control signal.

24. A system according to claim 15 wherein said controller is configured to: a) receive a sensor signal representing a sensed temperature of said IC-module, and b) send said control signal with an ON-OFF ratio that increases as the difference between said sensed temperature and said set-point increases.

25. A system according to claim 15 wherein said seal is shaped to encircle a surface on said IC-module which encloses an IC-chip.

26. A system according to claim 15 wherein said seal is shaped to encircle an exposed surface on an IC-chip in said IC-module.

27. A system according to claim 15, wherein said pressure regulator maintains said sub-atmospheric pressure such that the boiling point of said liquid coolant is lower by at least 10°C. from its boiling point at atmospheric pressure.

28. A system according to claim 15, wherein said heater comprises one or more infrared heating elements disposed in said container.

29. A system according to claim 15, wherein said infrared heating elements are interleaved with a plurality of nozzles.

30. A system according to claim 15, wherein said infrared heating elements surround a cluster of nozzles.

31. A system according to claim 15, wherein said container is detachable from said IC-module.

* * * * *